United States Patent [19]

Cherepin et al.

[11] 4,107,527
[45] Aug. 15, 1978

[54] ION-EMISSION MICROANALYZER MICROSCOPE

[76] Inventors: Valentin Tikhonovich Cherepin, ulitsa Lenina, 42, kv. 30; Valery Leonidovich Olkhovsky, prospekt Voroshilova, 17a, kv. 73, both of Kiev, U.S.S.R.

[21] Appl. No.: 815,443

[22] Filed: Jul. 13, 1977

[51] Int. Cl.² .............................................. H01J 37/26
[52] U.S. Cl. ................................... 250/309; 250/397; 250/292
[58] Field of Search .................. 250/309, 310, 396 R, 250/397, 398, 292

[56] References Cited
U.S. PATENT DOCUMENTS

| 2,947,868 | 8/1960 | Herzog | 250/309 |
|---|---|---|---|
| 2,976,413 | 3/1961 | Robinson | 250/292 |
| 3,517,191 | 6/1970 | Liebl | 250/309 |
| 3,986,025 | 10/1976 | Fujiwara et al. | 250/309 |

Primary Examiner—Alfred E. Smith
Assistant Examiner—B. C. Anderson
Attorney, Agent, or Firm—Haseltine, Lake, & Waters

[57] ABSTRACT

An ion-emission microanalyzer microscope, comprising a vacuum chamber housing an ion source with a focusing system for bombarding the surface of an object under investigation. In addition, arranged along the beam of secondary ions emitted by the bombarded surface of the object under investigation, in the vacuum chamber, are an immersion objective, an aperture diaphragm, an ion-optical converter, a mass filter, and an ion detector. The ion-optical converter has a through opening coaxial with the secondary ion beam, performing the function of an aperture for separating an image element. Outside the vacuum chamber, there is a recording device connected to the output of the ion detector.

3 Claims, 1 Drawing Figure

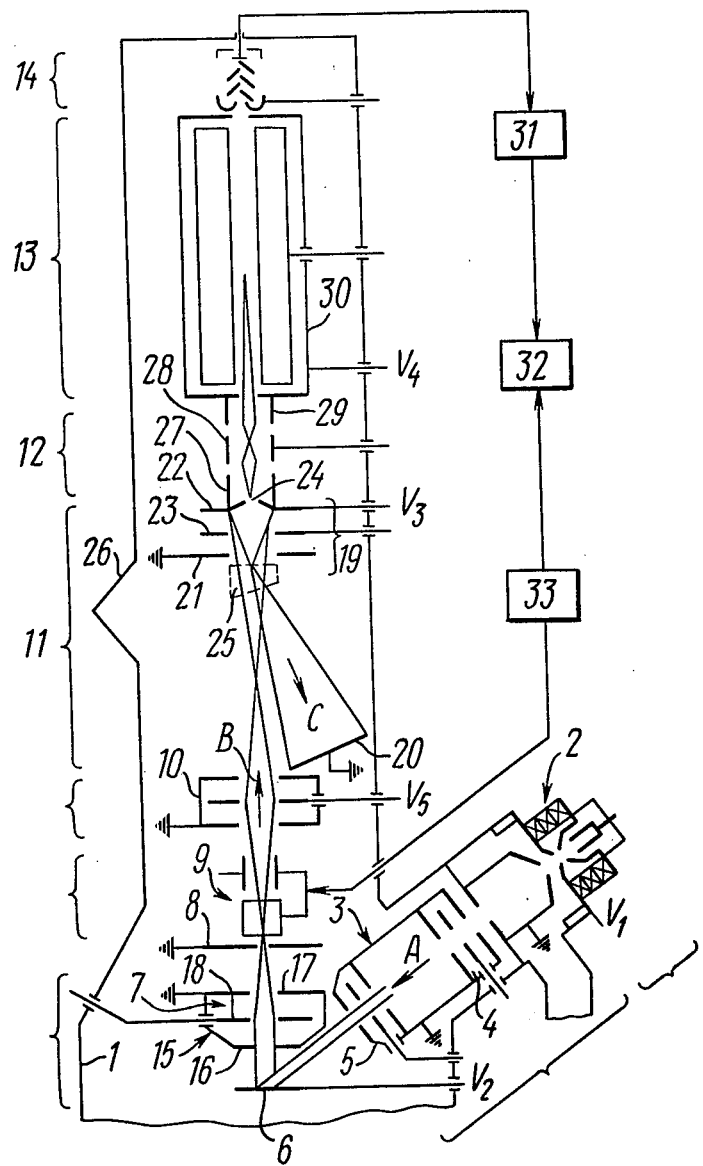

ION-EMISSION MICROANALYZER MICROSCOPE

BACKGROUND OF THE INVENTION

The present invention relates to a device for analyzing the composition of a substance, and more particularly to an ion-emission microanalyzer microscope intended for investigation of metal alloys and other solid materials by observing the surface structure of an object under investigation and by local and in-depth chemical and isotopic analysis.

Ion microanalyzers are known in which an object under investigation is bombarded with ions focused to a narrow beam (microprobe), and the secondary ions knocked out from the object are analyzed by means of a mass filter. In such microanalyzers, the problem of controlled selection of a portion of the object under investigation for mass-spectrometric analysis is solved by using mirror-lens optical microscopes, some of whose optical elements are in direct proximity to the object, whereby they can be contaminated with dust particles in the course of analysis, the performance of the microanalyzer.

Moreover, in the case of microprobes, difficulties arise in locating the point of bombardment in the course of analysis because the perceptible crater is formed only after the analysis is over. Local in-depth analysis is rendered difficult by the effect of the crater walls, particularly when the probe diameter is small.

Also known are microanalyzer microscopes in which the ionic image of the surface of an object under investigation, formed by the secondary ions knocked out from the object's surface by the ion beam is separated into elemental images in a magnetic mass filter. A separated image element formed by ions of a particular type is displayed on a luminescent screen with the aid of an ion-optical converter. In this case, the image is representative of the distribution topography only for that particular chemical element. Analysis of different chemical elements on the object's surface areas whose dimensions are determined by the optical resolution of the instrument, is made difficult in such a device because, as a result of the ion-optical converter being located behind the magnetic mass filter, the image of the object on the luminescent screen is shifted each time the mass filter is readjusted from one mass to another.

There is also known an ion-emission microanalyzer microscope comprising a vacuum chamber accommodating an ion source with a focusing system for bombarding the surface of an object under investigation, and the following components arranged in series along the beam of secondary ions emitted by the bombarded object's surface: an immersion objective, an aperture diaphragm, an aperture for separating an image element, a mass filter, and an ion detector. In addition, this prior art microanalyzer microscope includes a recording device located outside the vacuum chamber and connected to the output of the ion detector.

Such a microanalyzer microscope permits analysis of an object, with its spatial resolution being determined by the optical resolution of the microscope; however, no provision is made for selecting and locating the point at which local analysis is to be performed during analysis itself, and additional means for specifying the point of local analysis are required.

The principal object of the invention is to provide an ion-emission microanalyzer microscope in which the point of local analysis can be determined during analysis itself.

Another object of the invention is to provide an ion-emission microanalyzer microscope permitting selection of the point of local analysis.

Still another object of the invention is to provide an ion-emission microanalyzer microscope permitting local analysis of an object's surface over an area smaller than that impinged upon by the primary ion beam.

Yet another object of the invention is to provide an ion-emission microanalyzer microscope permitting the spatial resolution of analysis to be altered without changing the size of the primary beam incident upon the object.

SUMMARY OF THE INVENTION

These objects of the present invention are achieved by an ion-emission microanalyzer microscope comprising a vacuum chamber accommodating an ion source and a focusing system for bombarding the surface of an object under investigation, as well as an immersion objective, an aperture diaphragm, an aperture for separating an image element, a mass filter, and an ion detector, the above components being arranged in series along a beam of secondary ions emitted by the bombarded object's surface, and a recording device located outside the vacuum chamber and connected to the output of the ion detector; according to the invention, an ion-optical converter is provided behind the aperture diaphragm in the direction of the secondary ion beam, having a through opening coaxial with the beam and performing the function of the aperture for separating an image element.

To render analysis as local as possible, the diameter of said opening should preferably be selected equal to the optical resolution of the microscope, multiplied by the coefficient of linear magnification of the image in the opening plane.

To ensure a possibility of varying the local nature of analysis without changing the opening diameter, the ion-emission microanalyzer microscope should preferably be provided with a projection lens arranged before the ion-optical converter, in the direction of the secondary ion beam, at such a distance from the opening that the diameter of the collected secondary ion beam does not exceed that of the aperture in the aperture diaphragm.

The invention will now be described in greater detail with reference to a specific embodiment thereof, taken in conjunction with the accompanying drawing which shows schematically an ion-emission microanalyzer microscope according to the invention.

BRIEF DESCRIPTION OF THE DRAWING

A schematic view of an ion-emission microanalyzer microscope in accordance with the present invention.

DESCRIPTION OF THE PREFERRED EMBODIMENT

Referring to the drawing, a vacuum chamber 1 houses an ion source 2, in this case a cold-cathode duo plasmatron, and a focusing system 3 including two series-arranged Einzel lenses 4 and 5 coaxial with the ion source 2. The ion source 2 and focusing system 3 produce a primary ion beam (arrow A) to bombard a portion of the surface of an object 6 under investigation, also placed in the vacuum chamber 1. In addition, arranged in series along a secondary beam (arrow B) of ions emitted by the bombarded surface of the object 6, in the vacuum chamber 1, are an immersion objective 7, an aperture diaphragm 8, an electrostatic deflecting system 9, a projection lens 10, an ion-optical converter 11, a deceleration system 12, a quadrupole mass filter 13, and an ion detector 14.

The four-electrode immersion objective 7 is made up of the object 6 emitting a secondary ion beam and an axis-symmetric Einzel lens 15 including two grounded diaphragms 16 and 17 and an insulated diaphragm 18 arranged intermediate of the grounded diaphragms 16 and 17.

The diameter of the aperture in the aperture diaphragm 8 is selected smaller than the crossover of the secondary beam in the plane of the diaphragm 8.

The electrostatic deflecting system 9 comprises two pairs of planar plates arranged in series and at a right angle to each other.

The next component along the beam axis is the projection lens 10 which is essentially an Einzel lens similar to the above-described lens 15 except that its diaphragm apertures are larger in diameter.

The ion-optical converter 11 comprises an ion-electron converter 19 and a luminescent screen 20 converting an electron image into an optical one.

The ion-electron converter 19 is essentially a three-electrode immersion objective made up of a grounded diaphragm 21 serving as the anode with respect to electrons and a cathode 22 which is at a negative potential relative to the grounded anode 21, and a diaphragm 23 which is a focusing electrode, arranged therebetween. The cathode 22 is concave and has a radius of curvature ensuring uniform focusing, over the entire field of view, of the electron image in the plane of the flat luminescent screen 20. The cathode 22 is made from a material featuring a high electron emission coefficient to enhance the image brightness and provided with a through opening 24 coaxial with the secondary ion beam. In this embodiment, the opening 24 is made round and its diameter is equal to the optical resolution of the microscope, multiplied by the coefficient of linear magnification of the image produced by the immersion objective 7 in the plane of the opening 24 made in the cathode 22 of the ion-electron converter 19.

The thickness of the cathode 22 near the opening 24 does not exceed the diameter of the opening 24.

The projection lens 10 is located at such a distance from the plane of the opening 24 that the diameter of the collected secondary ion beam in the plane of the opening 24 does not exceed that of the aperture diaphragm 8. In this case, the projection lens 10 is placed in the middle between the plane of the aperture diaphragm 8 and that of the opening 24.

The opening 24 performs the function of an aperture for separating an image element. Arranged before the ion-electron converter 19, in the direction of the ion beam, is a magnetic prism 25 deflecting the electron beam (arrow C) towards the luminescent screen 20 positioned at an angle to the beam axis so that the electron beam from the ion-electron converter 19 is incident on the screen 20 at a right angle. An observation port 26 is provided in the wall of the vacuum chamber 1 for observing the image on the screen 20.

The deceleration system 12 comprises three series-arranged cylindrical electrodes 27, 28 and 29 of the same diameter, the electrode 27 being mechanically and electrically associated with the cathode 22, while the electrode 29 is likewise associated with a screen 30 of the quadrupole mass filter 13.

As the ion detector 14 use is made of a secondary-electron multiplier.

In addition, the ion-emission microanalyzer microscope of the present invention comprises the following components located outside the vacuum chamber 1: an electronic amplifier 31 having its input connected to the output of the ion detector 14, and a recording device 32, in this case a cathode ray tube, having one of its inputs connected to the output of the amplifier 31 and the other input connected to one of the outputs of a time-base generator 33 whose other output is connected to the deflecting system 9.

The herein-proposed ion-emission microanalyzer microscope operates as follows:

As soon as the ion source 2 and the electrodes of the device are energized (the power supplies are not shown), a primary ion beam (arrow A) with an energy determined by the difference of potentials $V_1$ and $V_2$ of the ion source 2 and object 6 under investigation, respectively, bombards a portion of the latter's surface.

The immersion objective 7 accelerates and focuses the secondary ions knocked out from the object 6 under the action of the primary ion beam, producing, in the plane of the cathode 22 of the ion-electron converter 19, a magnified image of the bombarded portion of the object's surface, as well as a magnified image of the opening 24 in the cathode 22. The latter image appears on the luminescent screen 20 as a stationary dark spot whose diameter is determined by the product of the diameter of the opening 24 in the cathode 22 by the linear magnification coefficient of the ion-electron converter 19.

By moving the object 6 in the plane of the bombarded surface or by moving the ion image of the object in the plane of the cathode 22, by means of the deflecting system 9, one matches the image of that portion of the investigated surface whose local chemical composition is to be determined with the stationary image of the opening 24 in the cathode 22.

The ions having passed through the opening 24 in the ion-optical converter 11 are decelerated in the field of the deceleration system 12 to an energy required for the operation of the quadrupole mass filter 13. Therewith, the energy of the ions reaching the mass filter 13 is determined by the difference of potentials $V_2$ of the object 6 and $V_4$ of the screen 30 of the quadrupole mass filter 13.

From the mass filter 13, the ions classified by masses arrive at the detector 14 at whose output there appears an electric signal carrying information on the elemental composition of the object's substance at the locally analyzed point. In this case, the local nature of the analysis is determined by the diameter of the opening 24 and the coefficient of linear magnification of the ion image of the object 6 in the plane of the cathode 22.

To change the spatial resolution of the analysis, the projection lens 10 is energized with potential $V_5$. By varying potential $V_5$, one changes the focal power of the lens 10, hence, the size of the ion image of the object 6 in the plane of the cathode 22 (i.e. the spatial resolution of the analysis) without altering the diameter of the opening 24. At a certain value of the focal power of the lens 10, the collected ion beam passes completely through the opening 24 in the cathode 22 with the result that the mass filter 13 receives the ions of a complete ion image of the surface under investigation.

When the scanning generator 33 is energized and the mass filter 13 is adjusted to a certain mass, a signal from the ion detector 14, amplified by the amplifier 31, is applied to the recording device 32 synchronized with the deflecting system 9 through the medium of the scanning generator 33.

As a result, an image is obtained in the recording device 32 (on the screen of the cathode ray tube), representative of the distribution of ions of a particular mass over the object's surface.

Thus, the ion-optical converter 11, with the opening 24 separating an image element, being arranged before the mass filter 13, permits visualization (on the screen 20) of an unseparated ion image representing the structure of the surface under investigation, with subsequent controlled selection of a portion of particular interest for conducting local chemical and isotopic analysis. Therewith, the accuracy of selecting an area for local analysis is enhanced, and it is no more necessary to use an optical microscope or other systems for specifying, on the object under investigation, the point or area of local analysis.

What is claimed is:

1. An ion-emission microanalyzer microscope comprising: a vacuum chamber; an ion source for bombarding the surface of an object under investigation, and located in said vacuum chamber; a focusing system arranged in said vacuum chamber coaxially with a beam of primary ions emitted by said source; an immersion objective arranged in said vacuum chamber coaxially with said beam of secondary ions emitted by the bombarded surface of said object; an aperture diaphragm arranged in said vacuum chamber after said immersion objective along said beam of secondary ions; an ion-optical converter arranged in said vacuum chamber after said aperture diaphragm along said beam of secondary ions; a through opening in said ion-optical converter, coaxial with said beam of secondary ions; said opening performing the function of an aperture for separating an image element; a mass filter arranged in said vacuum chamber after said ion-optical converter along said beam of secondary ions; an ion detector arranged in said vacuum chamber after said mass filter along said beam of secondary ions; and recording means located outside said vacuum chamber and electrically associated with the output of said ion detector.

2. An ion-emission microanalyzer microscope as claimed in claim 1, wherein the diameter of said opening is selected equal to the optical resolution of said microscope, multiplied by the coefficient of linear magnification of the ion image in the plane of said opening.

3. An ion-emission microanalyzer microscope as claimed in claim 2, including a projection lens arranged in said vacuum chamber before said ion-optical converter and along said beam of secondary ions, said projection lens being at such a distance from said opening that the diameter of the collected secondary ion beam in said opening does not exceed that of the aperture in said aperture diaphragm.

* * * * *